(12) United States Patent
Jung

(10) Patent No.: US 10,373,691 B2
(45) Date of Patent: Aug. 6, 2019

(54) NONVOLATILE MEMORY DEVICE AND OPERATING METHOD OF THE SAME

(71) Applicant: Samsung Electronics Co., Ltd., Suwon-si (KR)

(72) Inventor: Bong-Kil Jung, Seoul (KR)

(73) Assignee: SAMSUNG ELECTRONICS CO., LTD., Samsung-ro, Yeongtong-gu, Suwon-si Gyeonggi-do (KR)

( * ) Notice: Subject to any disclaimer, the term of this patent is extended or adjusted under 35 U.S.C. 154(b) by 0 days.

(21) Appl. No.: 15/950,757

(22) Filed: Apr. 11, 2018

(65) Prior Publication Data

US 2019/0096491 A1 Mar. 28, 2019

(30) Foreign Application Priority Data

Sep. 27, 2017 (KR) .......................... 10-2017-0125322

(51) Int. Cl.
| | |
|---|---|
| *G11C 16/04* | (2006.01) |
| *G11C 16/26* | (2006.01) |
| *G11C 16/10* | (2006.01) |
| *G06F 11/10* | (2006.01) |
| *G11C 16/08* | (2006.01) |

(52) U.S. Cl.
CPC .......... *G11C 16/26* (2013.01); *G06F 11/1008* (2013.01); *G11C 16/04* (2013.01); *G11C 16/08* (2013.01); *G11C 16/10* (2013.01)

(58) Field of Classification Search
CPC ......... G11C 16/26; G11C 16/04; G11C 16/08; G11C 16/10; G06F 11/1008

USPC ..................................................... 365/189.05
See application file for complete search history.

(56) References Cited

U.S. PATENT DOCUMENTS

| | | | |
|---|---|---|---|
| 8,631,288 B2 | 1/2014 | Helm et al. | |
| 8,873,285 B2 | 10/2014 | Sharon et al. | |
| 9,001,587 B2 | 4/2015 | Eun et al. | |
| 9,190,161 B2 | 11/2015 | Shibata | |
| 9,293,210 B2 | 3/2016 | Jang et al. | |
| 9,318,194 B1 | 4/2016 | Siau et al. | |
| 2008/0209110 A1* | 8/2008 | Pyeon ................. | G06F 13/4247 711/103 |
| 2015/0117125 A1* | 4/2015 | Choi ....................... | G11C 7/02 365/189.15 |
| 2017/0133087 A1 | 5/2017 | Park et al. | |

* cited by examiner

*Primary Examiner* — Vu A Le
(74) *Attorney, Agent, or Firm* — Muir Patent Law, PLLC

(57) ABSTRACT

A nonvolatile memory device includes a plurality of memory cells and a page buffer including a plurality of page buffer units each connected to the plurality of memory cells through one bit line of a plurality of bit lines and configured to generate output data based on data states of the plurality of memory cells. A first page buffer unit of the plurality of page buffer units includes first to third latches which latch first to third read data at first to third time points, respectively by developing a voltage level of the sensing node, and a fourth latch which generates a fourth read data based on the second and third read data. The first page buffer unit is configured to selectively output the fourth read data as the output data, depending on whether an error correction of the first read data is possible.

20 Claims, 13 Drawing Sheets

NONVOLATILE MEMORY DEVICE AND OPERATING METHOD OF THE SAME

CROSS-REFERENCE TO RELATED APPLICATION

This application claims priority from Korean Patent Application No. 10-2017-0125322 filed on Sep. 27, 2017 in the Korean Intellectual Property Office, and all the benefits accruing therefrom under 35 U.S.C. 119, the contents of which in its entirety are herein incorporated by reference.

BACKGROUND

1. Field of the Disclosure

The present disclosure relates to a nonvolatile memory device and a method of operating the same.

2. Description of the Related Art

Generally, semiconductor memory devices are divided into volatile memory devices in which stored information is lost with interruption of power supply, and nonvolatile memory devices capable of continuously maintaining the stored information even when the power supply is interrupted. NAND flash devices are currently widely used as the nonvolatile memory devices.

In order to enhance the degree of integration of the NAND flash device, a MLC (Multi-Level Cell) which stores 2-bit data in one memory cell or a TLC (Triple-Level Cell) which stores 3-bit data in one memory cell is used. Since the MLC or the TLC has the small margin between the states of the voltage corresponding to the reading voltage, error bits may increase in the read data.

In order to detect and correct such error bits, reading methods or error correction methods of various types have been proposed.

SUMMARY

An aspect of the present disclosure provides a nonvolatile memory device having improved performance and reliability.

Another aspect of the present disclosure provides a method of operating a nonvolatile memory device having improved performance and reliability.

According to an aspect of the present disclosure, a nonvolatile memory device includes a cell array including a plurality of memory cells which stores program data, and a page buffer including a plurality of page buffer units each connected to a set of the plurality of memory cells through one bit line of a plurality of bit lines connected to a sensing node, and configured to generate output data based on data states of the set of the plurality of memory cells. A first page buffer unit of the plurality of page buffer units includes a first latch configured to latch a first read data at a first time point by developing a voltage level of the sensing node based on data state of a selected memory cell, second and third latches configured to latch second and third data at second and third time points, respectively by developing the voltage level of the sensing node, wherein the second time point is earlier than the first time point and the third time point is later than the first time point, and a fourth latch configured to generate a fourth read data based on the second and third data. The first page buffer unit is configured to selectively output the fourth read data as the output data, depending on whether error correction of the first read data is possible.

According to another aspect of the present disclosure, a nonvolatile memory device includes a cell array including a plurality of memory cells which stores program data, and a page buffer including a plurality of page buffer units each connected to a set of the plurality of memory cells through one bit line of a plurality of bit lines connected to a sensing node, and configured to generate output data based on data states of the set of the plurality of memory cells. A first buffer unit of the plurality of page buffer units includes first to third latches configured to, in response to a single read command received from a memory controller, latch first to third read data at first to third time points, respectively by developing a voltage level of the sensing node based on data state of a selected memory cell, wherein the first to third time points are different from each other, and a fourth latch configured to generate a fourth read data based on the second and third data. The first page buffer unit is configured to selectively output the fourth read data as the output data, depending on whether an error correction of the first read data is possible by an error correction code (ECC) circuit.

According to another aspect of the present disclosure, a method of operating a nonvolatile memory device, the method includes applying a read voltage to a first word line of a plurality of word lines connected to a first memory cell of a plurality of memory cells, pre-charging a first bit line of a plurality of bit lines connected to the first memory cell, charging a sensing node connected to the first bit line to a first voltage, developing a voltage level of the sensing node through the first bit line based on data state of the first memory cell, latching first read data at a first time point by developing the voltage level of the sensing node wherein the first to third time points are different from each other, latching second and third data at second and third time points, respectively by developing the voltage level of the sensing node, generating a fourth read data based on the second and third read data, and selectively outputting the fourth read data depending on whether an error correction of the first read data is possible.

BRIEF DESCRIPTION OF THE DRAWINGS

The above and other aspects and features of the present disclosure will become more apparent by explaining in detail exemplary embodiments thereof with reference to the attached drawings, in which.

DETAILED DESCRIPTION

Figure 1:
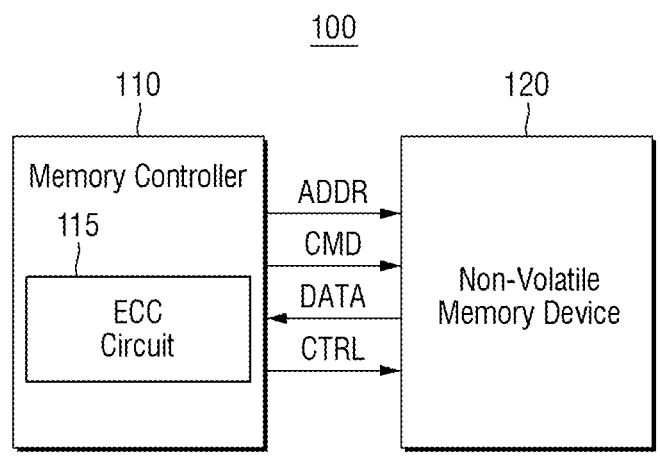
FIG. 1 is a block diagram illustrating a nonvolatile memory system according to some embodiments of the present disclosure.

Advantages and features of the present disclosure and methods of accomplishing the same may be understood more readily by reference to the following detailed description of preferred embodiments and the accompanying drawings. The present disclosure may, however, be embodied in many different forms and should not be construed as being limited to the embodiments set forth herein. In the drawings, the thickness of layers and regions are exaggerated for clarity.

FIG. 1 is a block diagram illustrating a nonvolatile memory system 100 according to some embodiments of the present disclosure.

Referring to FIG. 1, the nonvolatile memory system 100 includes a memory controller 110 and a nonvolatile memory device 120. The nonvolatile memory system 100 illustrated in FIG. 1 may include, but is not limited to, a data storage medium based on a flash memory, such as a memory card, a universal serial bus (USB) memory, and a solid-state drive (SSD).

The memory controller 110 controls the operation of the nonvolatile memory device 120. Specifically, the memory controller 110 may provide a command (CMD), an address (ADDR), a control signal (CTRL), and data (DATA) along input and output lines connected to the nonvolatile memory device 120.

The control signal CTRL provided by the memory controller 110 to the nonvolatile memory device 120 may include, but is not limited to, for example, a chip enable (CE), a writing enable (WE), a reading enable (RE) and the like.

The memory controller 110 may include an error correction code (ECC) circuit 115 which corrects error bits of the nonvolatile memory device 120. The ECC circuit 115 may correct the error bits included in the data of the nonvolatile memory device 120.

Specifically, the ECC circuit 115 may perform error correction encoding of data to be programmed in the nonvolatile memory device 120, and may generate data including parity bits. The parity bits may be stored in the nonvolatile memory device 120 together with the original data.

Further, the ECC circuit 115 may perform the error correction decoding on data that is read from the nonvolatile memory device 120. The ECC circuit 115 determines the success or failure of the error correction decoding, and may output the instruction signal in accordance with the determination result. The ECC circuit 115 may correct the error bits of the data, using the parity bits generated at the time of ECC encoding.

However, there is a limit to the number of error bits that can be corrected by the ECC circuit 115. A UECC (Uncorrectable Error Correction Code) error may occur if more error bits occur in the data than the error bits that can be corrected by the ECC circuit 115.

The ECC circuit 115 may perform the error correction, for example, using a coded modulation such as an LDPC (Low Density Parity Check) code, a BCH (Bose Chaudhuri Hocquenghem) code, a turbo code, a Reed-Solomon code, a convolution code, a RSC (Recursive Systematic Code), a TCM (Trellis Coded Modulation), and a BCM (Block Coded Modulation), but the disclosure is not limited thereto.

In some embodiments, the ECC circuit 115 generates a UECC error if more error bits occur than error bits that may be corrected. The memory controller 110 may read data from the nonvolatile memory device 120, using a second read voltage that is different from the first read voltage, if a UECC error occurs in the first read voltage. A detailed description of the operation of reading data stored in the nonvolatile memory device 120 will be described later.

Each of the memory controller 110 and the nonvolatile memory device 120 may be provided as one chip, one package, one module, or the like. The memory controller 110 and the nonvolatile memory device 120 may be mounted, for example, using PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual in-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flat Pack (TQFP), System In Package (SIP), Multi Chip Package (MCP), Wafer-Level Fabricated Package (WFP), and Wafer-Level Processed Stack Package (WSP).

Figure 2:
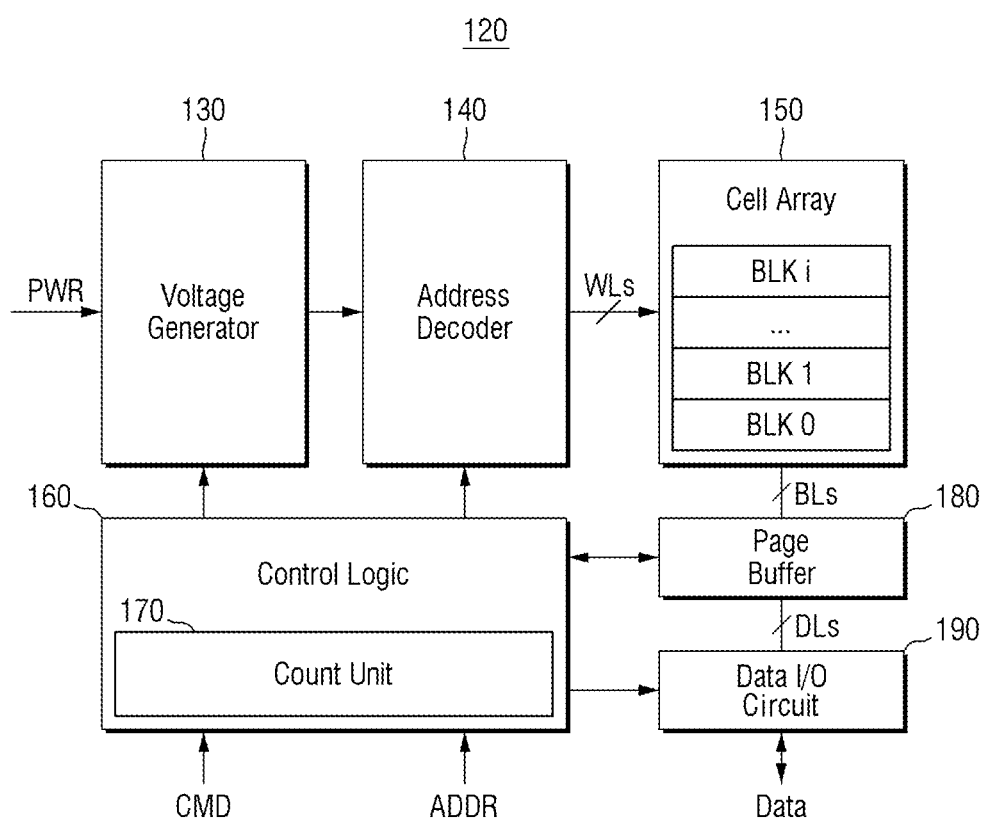
FIG. 2 is a block diagram illustrating a nonvolatile memory device illustrated in FIG. 1 according to some embodiments of the present disclosure.
Figure 3:
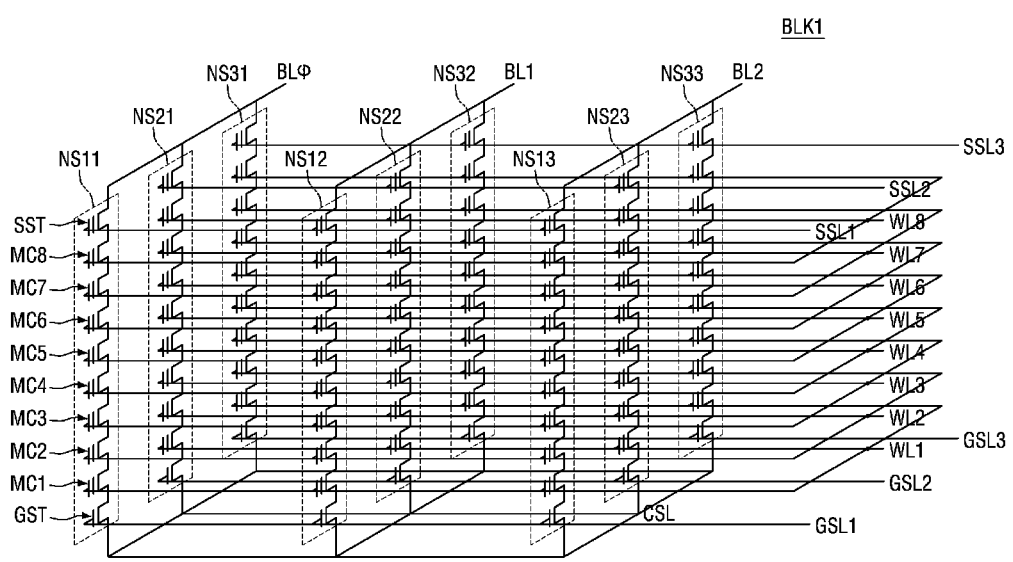
FIG. 3 is a circuit diagram illustrating a block structure included in the cell array as an example.

FIG. 2 is a block diagram for illustrating the nonvolatile memory device 120 illustrated in FIG. 1 according to some embodiments of the present disclosure, and FIG. 3 is a circuit diagram for illustrating a structure of a block BLK1 included in the cell array 150 as an example.

Referring to FIGS. 2 and 3, the nonvolatile memory device 120 includes a voltage generator 130, an address decoder 140, a cell array 150, a control logic 160, a phaser buffer 180, and a data input and output circuit 190.

The voltage generator 130 receives a power supply voltage PWR from the memory controller 110, and may generate a word line voltage required to read or write the data. The word line voltage may be provided to the cell array 150 via the address decoder 140.

The cell array 150 may be connected to a page buffer 180 through the bit lines BLs. The cell array 150 may include a plurality of NAND cell strings. The NAND cell strings included in the cell array 150 include respective channels, and these channels may be formed in a vertical or horizontal direction.

The cell array 150 may include a plurality of memory cells constituting the NAND cell string. The plurality of memory cells may be programmed, erased, and read by voltages provided to the word lines WLs or the bit lines BLs. The cell array 150 executes program and read operations on a page basis, and may execute an erase operation on the block (BLK0 to BLKi) basis.

An exemplary structure of the cell array 150 will be described in more detail with reference to FIG. 3.

Referring to FIG. 3, an exemplary structure of a memory block BLK1 included in a cell array 150 is illustrated. The memory block BLK1 may have a three-dimensional structure. Specifically, the memory block BLK1 may include a plurality of cell strings (NS11 to NS13, NS21 to NS23, and NS31 to NS33) arranged in a direction perpendicular to the substrate.

The cell strings NS11 to NS31 may be connected between a first bit line BL0 and a common source line CSL. The cell strings NS12 to NS32 may be connected between a second bit line BL1 and the common source line CSL. The cell strings NS13 to NS33 may be connected between a third bit line BL2 and the common source line CSL.

The cell strings NS11 to NS13 may be connected to a first ground selection line GSL1, a first string selection line SSL1, a common source line CSL, and a plurality of word lines (WL1 to WL8).

The cell strings NS21 to NS23 may be connected to a second ground selection line GSL2, a second string selection line (SSL2, the common source line CSL, and the plurality of word lines (WL1 to WL8).

The cell strings NS31 to NS33 may be connected to a third ground selection line GSL3, a third string selection line SSL3, the common source line CSL, and the plurality of word lines (WL1 to WL8).

Each of the plurality of cell strings (NS11 to NS13, NS21 to NS23, and NS31 to NS33) may include a plurality of memory cells (MC1 to MC8) aligned in a direction perpendicular to the substrate. In FIG. 2, one cell string (e.g., NS11) is illustrated to include eight memory cells (MC1 to MC8), but this is an example, and the present disclosure is not limited to include the eight memory cells for each cell string.

The selection transistors SST of the cell string of the same row may share the string selection line SSL. The string selection transistors SST of the cell strings of different rows may be connected to the different string selection lines (SSL1 to SSL3), respectively.

The cell strings (NS11 to NS13, NS21 to NS23, and NS31 to NS33) of the same row may share the word lines (WL1 to WL8). At the same height from the substrate, the word lines (WL1 to WL8) connected to the memory cells (MC1 to MC8) of the string cells NS of different rows may be connected in common.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

The ground selection transistors GST of the cell strings of the same row may share the ground selection line GSL. The ground selection transistors GST of the cell strings of different rows may be connected to the different ground selection lines (GSL1 to GSL3), respectively.

In FIG. 3, the structure of the memory block BLK1 has been described as an example. However, it is obvious that the structure of the memory block BLK1 of FIG. 3 may also be applied to the case of other memory blocks (BLK0, and BLK2 to BLKi) included in the cell array 150.

Hereinafter, description will be given on the assumption that the cell array 150 of FIG. 2 has the structure of the memory block illustrated in FIG. 3.

Referring to FIGS. 2 and 3 together, an address decoder 140 may be connected to the cell array 150 via the selection lines (SSL1 to SSL3 and GSL1 to GSL3) or the word lines (WL1 to WL8). At the time of a program or reading operation, the address decoder 140 may provide a program voltage or a read voltage for selecting one of the word lines (e.g., WL1) on the basis of the address ADDR provided by the memory controller 110.

A control logic 160 may control operations such as program, reading, and erasing of the cell array 150, using the command CMD, the address ADDR, and the like. For example, in the reading operation of data stored in the cell array 150, the control logic 160 controls the address decoder 140 on the basis of the command CMD and the address ADDR such that the read voltage is supplied to the word lines (WL1 to WL8). At the same time, the control logic 160 may read the data of the selected page, by controlling the page buffer 180 and the data input and output circuit 19.

As it will be described later, the control logic 160 may provide latch signals (LS1 to LS4) and a dump signal Dump for controlling the latches 181 to 185 included in the page buffer 180. The latches 181 to 185 included in the page buffer 180 may sense a voltage level of the sensing node S0 on the basis of the latch signals (LS1 to LS4) and the dump signal Dump, respectively.

In some embodiments of the present disclosure, the control logic 160 may include a count unit 170. The count unit 170 may count a number of memory cells corresponding to a specific threshold voltage range from the data sensed from the page buffer 180. This will be described in detail later.

The embodiments are described, and illustrated in the drawings, in terms of functional blocks, units and/or modules. These blocks, units and/or modules may be physically implemented by electronic (or optical) circuits such as logic circuits, discrete components, microprocessors, hard-wired circuits, memory elements, wiring connections, and the like, which may be formed together in a single integrated circuit (e.g., as a single semiconductor chip) or as separate integrated circuits and/or discrete components (e.g., several semiconductor chips wired together on a printed circuit board) using semiconductor fabrication techniques and/or other manufacturing technologies. These blocks, units and/or modules may be implemented by a processor (e.g., a microprocessor, a controller, a CPU, a GPU) or processors that are programmed using software (e.g., microcode) to perform various functions discussed herein. Each block, unit and/or module may be implemented by dedicated hardware, or as a combination of dedicated hardware to perform some functions and a processor to perform other functions. Also, each block, unit and/or module of the embodiments may be embodied by physically separate circuits and need not be formed as a single integrated.

Figure 4:
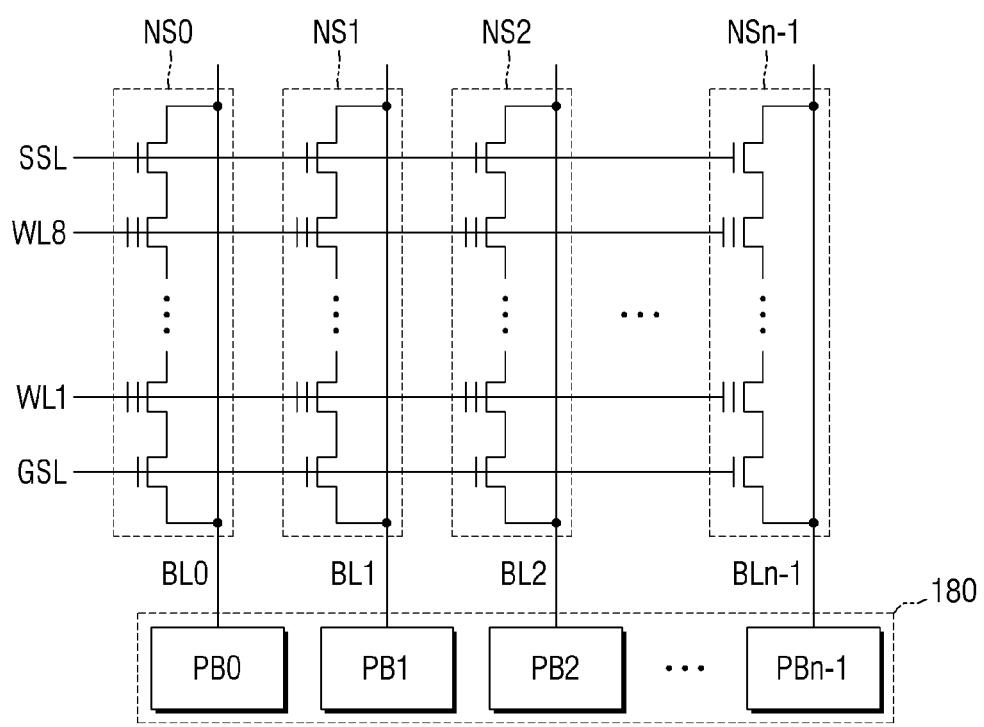
FIG. 4 is a circuit diagram illustrating a configuration of a cell string and a page buffer included in the cell array.
Figure 5:
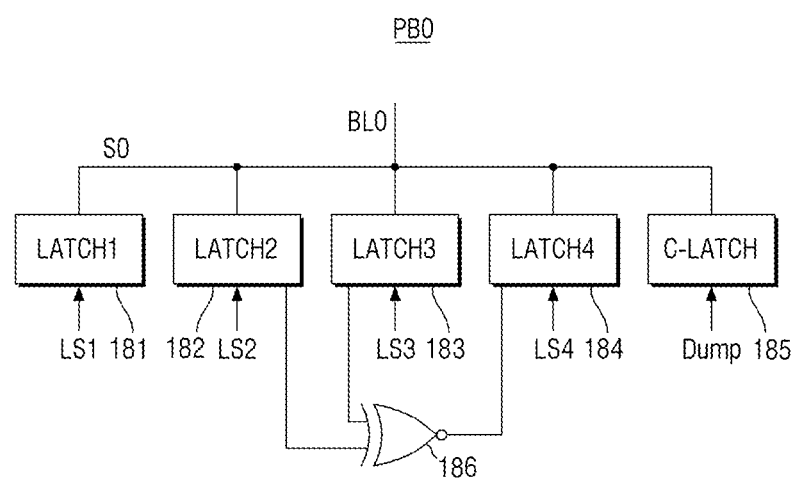
FIG. 5 is a schematic diagram illustrating a structure of the page buffer of FIG. 4 according to some embodiments of the present disclosure.

FIG. 4 is a circuit diagram for explaining a configuration of the page buffer 180 connected to the cell array 150, and FIG. 5 is a block diagram for explaining the structure of the page buffer unit PB0 of FIG. 4 according to some embodiments of the present disclosure.

Referring to FIGS. 4 and 5, the page buffer 180 may be connected to the cell array 150 via the bit lines (BL0 to BLn-1). The page buffer 180 may operate as a write driver or a sense amplifier. At the time of a read operation for the cell array 150, the page buffer 180 may sense the data stored in the selected memory cell through the bit lines (BL0 to BLn-1).

The page buffer 180 may include a plurality of page buffer units (PB0, PB1, . . . , PBn-1) connected to each of the bit lines (BL0 to BLn-1).

The page buffer unit PB0 may include a sensing node S0 connected to the bit line BL0 through one or more circuits (e.g., a logic circuit, not shown), and a plurality of latches 181, 182, 183, 184, and 185 connected to the sensing node S0. The page buffer 180 includes a plurality of page buffer units (PB0, PB1, . . . , PBn-1), and each of the plurality of page buffer units (PB0, PB1, . . . , PBn-1) may include a plurality of latches 181, 182, 183, 184, and 185.

The page buffer unit PB0 may include first to fourth latches 181 to 184, and a C-latch 185. In FIG. 5, the page buffer unit PB0 is exemplarily illustrated as including five latches 181 to 185, but the present disclosure is not limited thereto.

Each of the first to third latches 181 to 183 may store data state stored in a memory cell of the cell string NS0. That is, data indicating whether to turn on/off the memory cell selected in accordance with each word line voltage may be stored in the first to third latches 181 to 183. The first to third latches 181 to 183 in the page buffer unit PB0 may latch data under different conditions (e.g., latch at different time points) by developing a voltage level of the sensing node S0 based on data of a selected memory cell, and may store the latched data in the first to third latches 181 to 183. A word line connected to the selected memory cell is applied a read voltage having the same voltage level during the developing a voltage level of the sensing node S0.

The first to third latches 181 to 183 may receive the first to third latch signals (LS1 to LS3) from the control logic 160.

The first latch 181 to the third latch 183 may latch data at different development time points by developing the voltage level of the sensing node S0 based on data of the selected memory cell, and may store data indicating whether to turn on/off the memory cell.

The first latch 181 latches a first read data in response to the first latch signal LS1 by developing the voltage level of the sensing node S0, and may store the first read data indicating whether to turn on/off the memory cell included in the cell string NS0. The first latch 181 may store the determination whether to turn on/off the memory cell as the first read data.

The second latch 182 latches a second read data in response to the second latch signal LS2 by developing the voltage level of the sensing node S0, and may store the second read data indicating whether to turn on/off the memory cell included in the cell string NS0. The second latch 182 may store the determination whether to turn on/off the memory cell as the second read data.

The third latch 183 latches a third read data in response to the third latch signal LS3 by developing the voltage level of the sensing node S0, and may store the third read data indicating whether to turn on/off the memory cell included in the cell string NS0. The third latch 183 may store the determination whether to turn on/off the memory cell as the third read data.

Further, the first to third latch signals (LS1 to LS3) may be provided to the first to third latches 181 to 183 at different time points, respectively. For example, the first latch signal LS1 is provided to the first latch 181 at a reference time point (e.g., a time point $T_2$ in FIG. 9) such that the first latch 181 latches the first read data at the reference time point by developing a voltage level of the sensing node S0.

The second latch signal LS2 is provided to the second latch 182 at a first time point (e.g., a time point $T_{2-\Delta}$ in FIG. 9) different from the reference time point, such that the second latch 182 latches the second read data at the first time point by developing a voltage level of the sensing node S0. The first time point may be, for example, a time point earlier than the reference time point by a predetermined time.

On the other hand, the third latch signal LS3 is provided to the third latch 183 at a second time point (e.g., a time point $T_{2+\Delta}$ in FIG. 9) later than the first time point such that the third latch 183 latches the third read data at the second time point by developing a voltage level of the sensing node S0. The second time point may be, for example, a time point later than the reference time point by a predetermined time.

A configuration in which each of the first to third latches 181 to 183 latches data at different time points by developing the voltage level of the sensing node S0 may obtain the effect similar to a configuration of reading whether to turn on/off the memory cell by applying the word line voltage of different voltage levels to the same word line. This will be described in detail later.

The fourth latch 184 may store a fourth read data generated based on the second read data stored in the second latch 182 and the third read data stored in the third latch 183.

In some embodiments of the present disclosure, the fourth latch 184 may store soft decision data (e.g., a fourth read data) based on soft decision read values (e.g., second and third read data) stored in the second latch 182 and the third latch 183. Specifically, the fourth latch 184 may store the data obtained by performing an XNOR operation of the data stored in the second latch 182 and the third latch 183, as the fourth read data. The page buffer unit PB0 may generate the fourth read data to be stored in the fourth latch 184, using the XNOR gate 186.

The control logic 160 may temporarily store the data of the first to fourth latches 184 in the C-latch 185, before providing the data to the data input and output circuit 190. The C-latch 185 may latch and store the data of the first to fourth latches 184 by the dump signal Dump.

The data input and output circuit 190 may be connected to the page buffer 180 via the data lines DLs. Further, the data input and output circuit 190 may provide data, which is output from the page buffer 180, to the memory controller 110.

The data input and output circuit 190 receives data to be programmed into the cell array 150 of the nonvolatile memory device 120 from the memory controller 110 during a program operation, and may provide read data stored in the cell array 150 to the memory controller 110 during a read operation.

In example embodiments, for an operation of the nonvolatile memory device 120, the nonvolatile memory device 120 may receive a single read command from the memory controller 110, the voltage generator 130 may generate a read voltage having a first voltage level, the address decoder 140 may supply the read voltage to a selected word line of the cell array 150, and the page buffer unit PB0 may generate first to third read data by latching data states of the sensing node at different time points $T_{2-\Delta}$, $T_2$, and $T_{2+\Delta}$, respectively.

In example embodiments, the page buffer unit PB0 may generate the fourth read data in response to either a single read command or an additional command received from the memory controller 110.

Figure 6A:
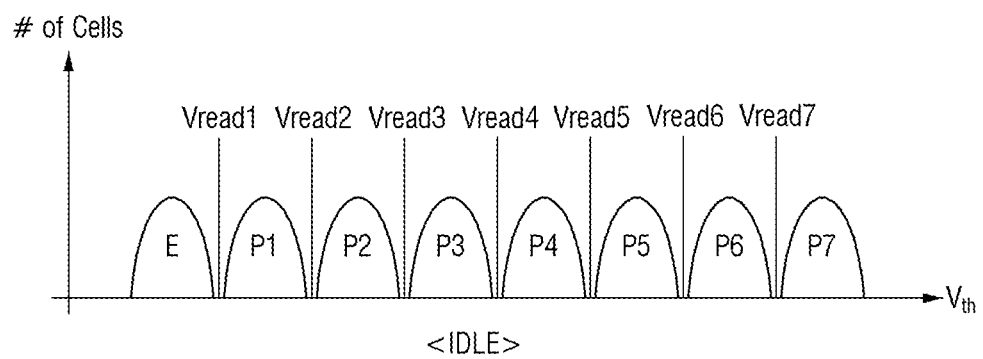
FIG. 6A illustrates a threshold voltage distribution of a program state and an erase state after the normal program operation of the TLC memory.

FIG. 6A illustrates the threshold voltage distribution of the program state and the erase state after the normal program operation of the TLC memory.

Referring to FIG. 6A, in the case of a TLC memory capable of storing 3 bits in one memory cell, in order to program three bits in one memory cell, any one of eight threshold voltages is formed in the memory cell. However, due to the difference in electrical characteristics between the plurality of memory cells, the threshold voltages of the plurality of memory cells programmed with the same data may form a threshold voltage distribution in a certain range.

In the case of TLC as illustrated in FIG. 6A, the threshold voltage distributions corresponding to one erase state E and seven program states (P1 to P7) are formed. Further, FIG. 6A illustrates the case where the threshold voltage distributions are ideally distributed like just after data is programmed, and a read voltage (Vread1 to Vread7) is obtained for each threshold voltage distribution.

Figure 6B:
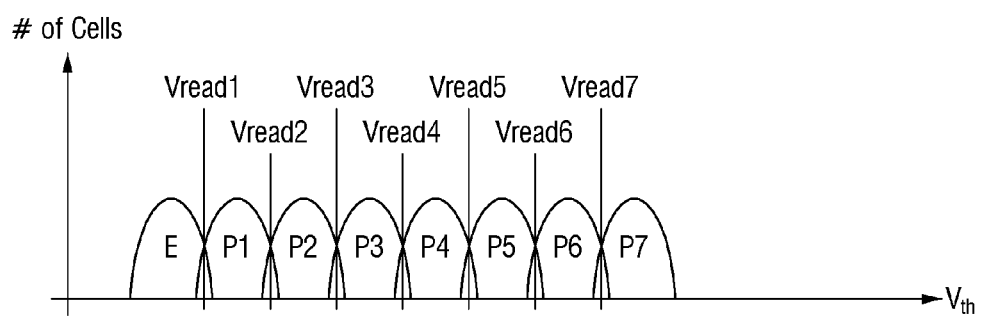
FIG. 6B illustrates a threshold voltage distribution in a case where the program and the erase are repeated after the memory is completed in the TLC, and the characteristics of the memory cell deteriorate.

FIG. 6B illustrates the threshold voltage distribution in the case where the characteristics of the programmed memory cells are deteriorated by repetition of program and erase of memory cells connected to word lines adjacent to word lines of the programmed memory cells.

Referring to FIG. 6B, a case is illustrated in which the threshold voltage distribution moves to the left or the right, in accordance with a charge loss generated by discharge of electrons stored in a memory cell with the lapse of time. As a result, the threshold voltage distributions of the erase state E and the seven program states (E1 to E7) may overlap each other.

When the threshold voltage distributions overlap, UECC caused by many error bits may occur when applying the reading voltage. That is, when the first read voltage Vread 1 is applied, the case of on-cell means an erase state E, and the case of the off-cell means a state P1. However, in the case of overlap as illustrated in FIG. 6B, by reading off-cell in spite of the on-cell state, the probability of being determined to be an error bit may increase.

Therefore, the nonvolatile memory device according to the embodiment of the present disclosure uses a hard decision and a soft decision as a mechanism for correcting such an error bit.

Figure 7:
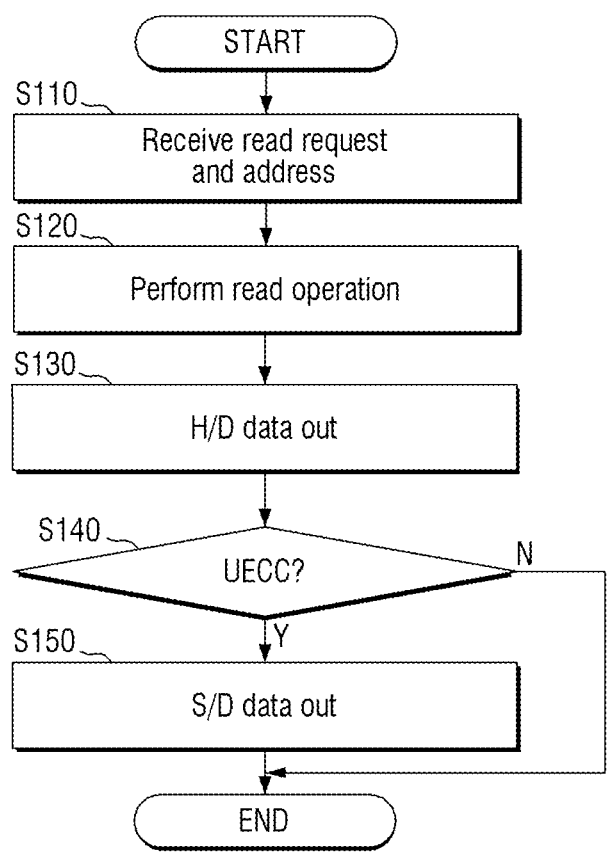
FIG. 7 is a flowchart illustrating an operation method of the nonvolatile memory device according to some embodiments of the present disclosure.

FIG. 7 is a flowchart for explaining an operation method of the nonvolatile memory device according to some embodiments of the present disclosure.

Referring to FIG. 7, the method of operating the nonvolatile memory device according to some embodiments of the present disclosure includes receiving a reading request command CMD (e.g., a read command) and an address ADDR from a memory controller 110 (S110).

Subsequently, the memory controller 110 may perform a reading operation of the data stored in the nonvolatile memory device 120 (S120). The reading operation performed by the nonvolatile memory device will be described with reference to FIGS. 8 through 10.

In operation S130, the page buffer unit PB0 may output data (e.g., hard decision data) stored in the C-latch 185 (e.g., a fifth latch) to the data input output circuit 190 and the data input output circuit 190 may provide the hard decision data to the ECC circuit 115 of the memory controller 110.

In operation S140, the ECC circuit 115 performs an error correction of the hard decision data. If the error correction fails (i.e., a UECC occurs) the method may proceed to operation S150.

In operation S150, the page buffer unit PB0 may provide data (e.g., soft decision data) stored in the C-latch 185 to the data input output circuit 190 and the data input output circuit 190 may provide the soft decision data to the ECC circuit 115 of the memory controller 110. The ECC circuit 115 may perform an error correction again using the soft decision data. In operation S150, ratio information of the soft decision data may be output when the data input output circuit 190 outputs the soft decision data. For example, the ratio information of the soft decision data may be a ratio a difference of time between time points $T_2$ and $T_{2-\Delta}$ and a difference of time between time points $T_2$ and $T_{2+\Delta}$.

Figure 8:
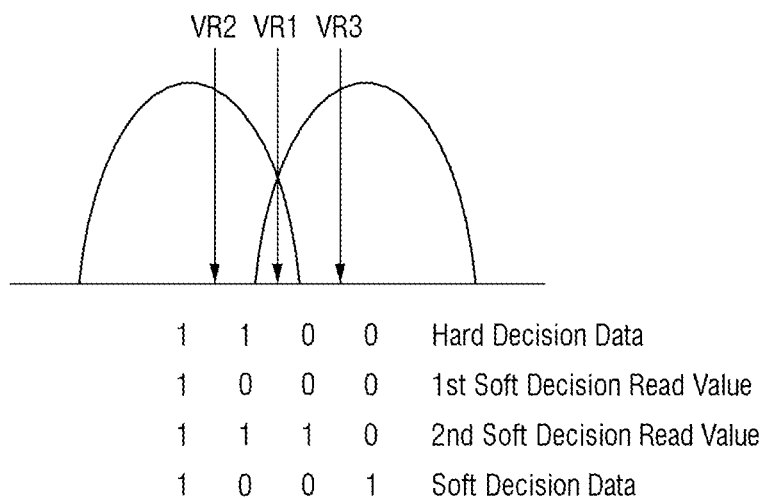
FIG. 8 is a schematic diagram illustrating a hard decision reading operation and a soft decision reading operation executed by the nonvolatile memory device according to some embodiments of the present disclosure.

FIG. 8 is a schematic diagram for explaining the hard decision reading operation and the soft decision reading operation performed by the nonvolatile memory device according to some embodiments of the present disclosure. Although it will be additionally described later, the nonvolatile memory device of the present disclosure obtains an effect in which the first to third latches 181 to 183 latch data at different time points by developing the voltage level of the sensing node S0, thereby reading the data of the memory cell with the reading voltage of different voltage levels on the same word line. However, it is assumed that the hard decision reading operation and the soft decision reading operation are executed, using the three read voltages (VR1, VR2, and VR3) for the convenience of description with reference to FIG. 8.

The hard decision reading operation means a normal data reading operation, and means that the data stored in the memory cell is read as 1 or 0 depending on the ON-state or OFF-state of the memory cell, when the read voltage is supplied to the word line of the memory cell.

In FIG. 8, the hard decision read voltage means VR1. When the VR1 is applied to the memory cell via the word line, if the memory cell is in the ON-state, the hard decision data becomes "1", and if the memory cell is in the OFF-state, the hard decision data becomes "0". FIG. 8 illustrates a configuration in which, on the basis of the hard decision read voltage VR1, by determining the voltage level located on the left side as ON (1) and by determining the voltage level located on the right side as OFF (0), the hard decision data may be set to 1, 1, 0, and 0.

The hard decision data generated on the basis of the hard decision read voltage VR1 may be transmitted to the page buffer 180 through the bit line BLs. The first latch 181 latches a first read data based on the first latch signal LS1 (in FIG. 5) by developing the voltage level of the sensing node S0, and stores the first read data as the hard decision data. The control logic 160 generates the first latch signal LS1 on the basis of the address ADDR and may control the first latch 181, using the first latch signal LS1.

The soft decision reading operation means reading the determination whether or not to turn on or off the memory cell, using at least one or more read voltages having a certain difference with reference to the hard decision read voltage VR1.

In FIG. 8, the soft decision read voltages means VR2 and VR3. Here, VR2 is defined as a first soft decision read voltage, and VR3 is defined as a second soft decision read voltage. The first soft decision read voltage VR2 is smaller than the hard decision read voltage VR1, and the second soft decision read voltage VR3 may be larger than the hard decision read voltage VR1. The voltage difference between the first soft decision read voltage VR2 and the hard decision read voltage VR1 may be the same as the voltage between the second soft decision read voltage VR3 and the hard decision read voltage VR1, but the present disclosure is not limited thereto.

As illustrated in FIG. 8, the first soft decision read value determined by applying the first soft decision read voltage VR2 to the word line is 1, 0, 0, and 0, and the second soft decision read value determined by applying the second soft decision read voltage VR3 to the word line is 1, 1, 1, and 0.

The first soft decision read value and the second soft decision read value generated in the first and second soft decision read voltages VR2 and VR3 may be transmitted to the page buffer 180 via the bit line BLs. The second latch 182 latches a second read data based on the second latch signal LS2 (in FIG. 5) by developing the voltage level of the sensing node S0, and stores the second read data as the first soft decision read value. The third latch 183 latches a third read data based on the third latch signal LS3 (in FIG. 5) by developing the voltage level of sensing node S0, and stores the third read data as the second soft decision read value. The control logic 160 generates the second and third latch signals (LS2 and LS3) on the basis of the address ADDR, and may control the second and third latches 182 and 183, using the same. In this case, the first to third latch signals LS1 to LS3 may be the same signals.

A fourth read data as the soft decision data may be generated on the basis of the first and second soft decision read values. In some embodiments, the soft decision data may be data generated by performing the XNOR operation of the first and second soft decision read values with each other. As a result of performing the XNOR operation on the previously obtained first and second soft decision read values, the soft decision data may be generated as 1, 0, 0, and 1.

The soft decision data may add reliability to the hard decision data. For example, when the soft decision data is 1, it means that the hard decision data may have a strong reliability, and when the soft decision data is 0, it means that the hard decision data may have a weak reliability.

The fourth latch 184 may store the soft decision data on the basis of the control of the fourth latch signal LS4 (in FIG. 5). Alternatively, the control logic 160 includes a logic circuit for generating the soft decision data on the basis of the first and second soft decision read values, and may provide the soft decision data generated from the logic circuit to the fourth latch 184.

Figure 9:
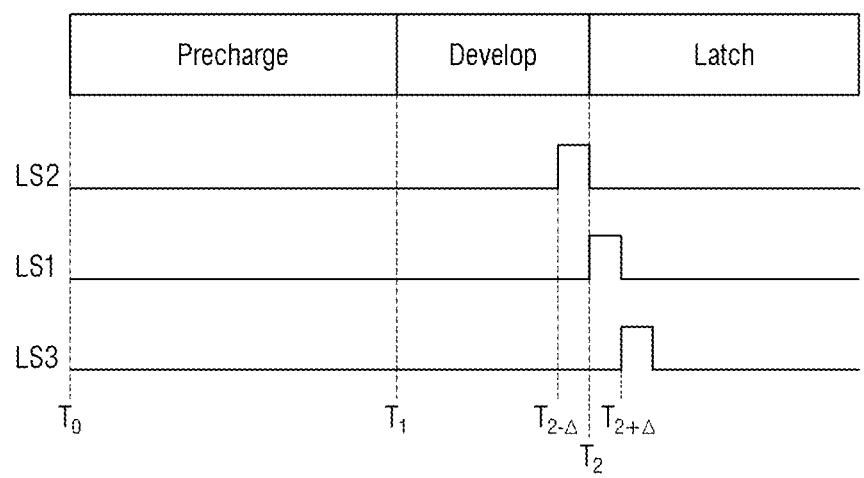
FIGS. 9 and 10 are timing diagrams illustrating a method of storing data by the nonvolatile memory device according to some embodiments of the present disclosure in a manner of latching data of the sensing nodes at different development time points.
Figure 10:
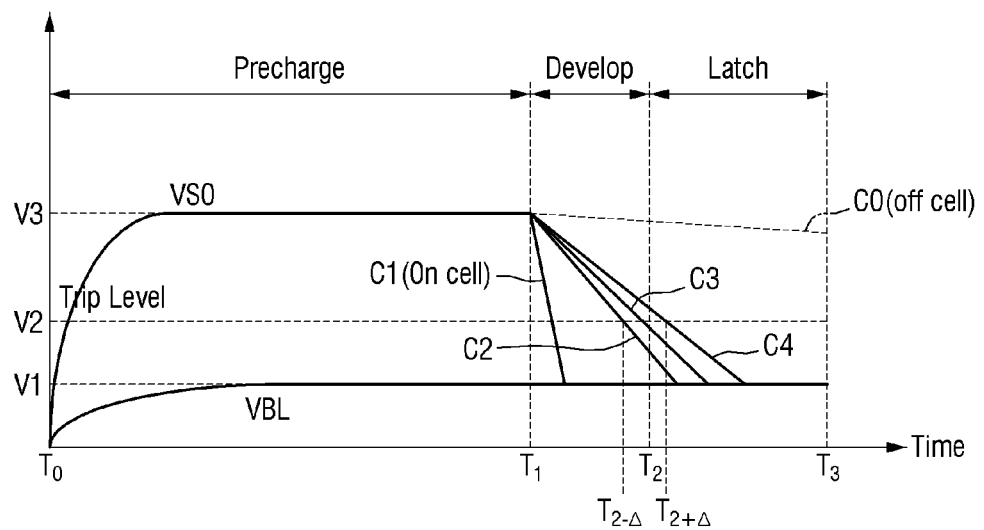

FIGS. 9 and 10 are timing charts for explaining a method of storing data by the nonvolatile memory device according to some embodiments of the present disclosure in a manner of latching data of the sensing nodes at different development time points.

A pre-charge operation of the bit line BL0 is executed between a time point $T_0$ and a time point $T_1$. The sensing node S0 connected to the bit line BL0 may be charged to a specific voltage level (e.g., VSO) during a pre-charge operation. The sensing node S0, for example, may be charged by the power supply voltage PWR.

The supply from the power supply voltage PWR to the sensing node S0 is cut off at the time point $T_1$. While a read voltage is applied to a selected word line, the voltage level of the sensing node S0 changes (i.e., the voltage level is developing) in accordance with the magnitude of the current flowing to the bit line BL0 depending on whether to turn on/off the memory cell. For example, when the selected memory cell is an on-cell, the current flowing through the bit line BL0 is relatively large, and thus, the voltage level of the sensing node S0 is relatively rapidly lowered. When the selected memory cell is the off-cell, the current flowing through the bit line BL0 is relatively small, and thus, the voltage level of the sensing node S0 will be relatively constant.

When the development time of the sensing node is enlarged (e.g., the third latch signal LS3 is enabled later than the second latch signal LS2), the memory cell originally determined as off-cell may be determined as an on-cell. On the other hand, when the development time of the sensing node is reduced (e.g., the first latch signal LS1 is enabled earlier than the second latch signal LS2), the memory cell originally determined as the on-cell may be determined as the off-cell.

The first latch 181 may latch a first read data by developing the voltage level of the sensing node S0 in response to the first latch signal LS1 at a time point $T_2$, the second latch 182 may latch a second read data by developing the voltage level of the sensing node S0 in response to the second latch signal LS2 at a time point $T_{2-\Delta}$, and third latch 183 may latch a third read data by developing the voltage level of the sensing node S0 in response to the third latch signal LS3 at a time point $T_{2+\Delta}$.

For example, in the case of a memory cell having a threshold voltage of level similar to the reading voltage (e.g., VR1 in FIG. 8) provided to the word line, when increasing the development time of the sensing node S0, the effect of increasing the reading voltage may be provided. On the other hand, when decreasing the development time of the sensing node S0, in the case of a memory cell having a threshold voltage of level similar to the reading voltage (e.g., VR1), an effect of lowering the reading voltage may be obtained.

In example embodiments, the page buffer unit PB0 may latch the first to third read data in response to the first to third latch signals LS1 to LS3 at different time points $T_{2-\Delta}$, $T_2$, and $T_{2+\Delta}$, respectively by receiving a single read command from the memory controller 110. The page buffer unit PB0 may also generate the fourth read data (i.e., soft decision data) and latch the soft decision data in response to the fourth latch signal LS4 by receiving the single read command from the memory controller 110. In other example embodiments, page buffer unit PB0 may generate the soft decision data by receiving an additional command from the memory controller 110.

Referring to FIG. 10, a strong off-cell voltage curve C0 or a strong on-cell voltage curve C1 which is not affected by the development time of the sensing node S0 is illustrated. Here, the voltage of the sensing node S0 is illustrated as VSO, and the voltage of the bit line is illustrated as VBL. As an example, at a time point $T_0$, the page buffer unit PB0 may start charging the sensing node S0 to a voltage level V3. As another example, at a time point $T_0$, the page buffer unit PB0 may finish charging the sensing node S0 to a voltage level V3

Also, voltage curves C2, C3, and C4 that may be affected by the development time of the sensing node S0 are illustrated. The case of the voltage curve C2 illustrates a change in the voltage of the sensing node S0 at the time of development of the memory cell having the threshold voltage lower than the reading voltage V2. The case of the voltage curve C3 illustrates the change in the voltage of the sensing node S0 at the time of development of the memory cell having the threshold voltage substantially similar to the reading voltage V2. The voltage curve C4 illustrates the change in the voltage of the sensing node S0 at the time of development of the memory cell having the threshold voltage higher than the reading voltage V2.

For example, when the latch time is advanced (e.g., $T_{2-\Delta}$) with reference to the time point $T_2$, the memory cell corresponding to the voltage curve C2 may be latched to the logic value corresponding to the off-cell. This has the same effect as decreasing the reading voltage.

Conversely, when the latch time is delayed (e.g., $T_{2+\Delta}$) with reference to the time point $T_2$, the memory cell corresponding to the voltage curve C4 is latched to the logic value corresponding to the on-cell. This has the same effect as increasing the reading voltage.

As described above, the nonvolatile memory device according to the embodiment of the present disclosure obtains the same effect as changing the reading voltage to sense the data stored in the memory cell by adjusting the latch time point at the time of development. Adjustment of the latch time points may be achieved by adjusting the supply time points of the first to third latch signals (LS1 to LS3) provided to the first to third latches 181 to 183. Therefore, the latch operation for the sensing node S0 by the first to third latches 181 to 183 may be completed within a short time, and then the reading operation of the memory cell may be completed within a shorter time than the case of changing the reading voltage provided to the word line.

Here, the data obtained by latching a voltage of the sensing node S0 at the time point $T_2$ may be the same as the data sensed by the hard decision read voltage VR1 in FIG. 8. The data obtained by latching a voltage of the sensing node S0 at the time point $T_{2-A}$ may be the same as the data sensed by the first soft decision read voltage VR2 in FIG. 8. The data obtained by latching a voltage of the sensing node S0 at the time point $T_{2+A}$ may be the same as the data sensed by the second soft decision read voltage VR3 in FIG. 8.

After the latch operation of the first to third latches 181 to 183 is completed, the XNOR operation between the second read data and the third read data stored in the second latch 182 and the third latch 183 is performed, and the result of the XNOR operation may be stored in the fourth latch 184.

Referring again to FIG. 7, the controller 110 receives the hard decision data stored in the first latch 181, and determines whether the UECC error occurs in the hard decision data, using the ECC circuit 115 (S140). If no UECC error occurs, the hard decision data stored in the first latch 181 is provided to the data input and output circuit 190 via the data line DLs. For example, after the page buffer 180 dumps the hard decision data stored in the first latch 181 to the C-latch 185, the page buffer 180 may provide the hard decision data stored in the C-latch 185 to the data input and output circuit 190. Thereafter, the data input and output circuit 190 may provide the hard decision data to the ECC circuit 115 of the memory controller 110. The ECC circuit 115 may try to correct the error bit using the provided hard decision data.

When a UECC error occurs, the soft decision data stored in the fourth latch 184 is provided to the data input and output circuit 190 via the data line DLs. For example, after the page buffer 180 dumps the soft decision data stored in the fourth latch 184 to the C-latch 185, the page buffer 180 may provide the soft decision data stored in the C-latch 185 to the data input and output circuit 190. Thereafter, the data input and output circuit 190 may provide the soft decision data to the ECC circuit 115 of the memory controller 110. In some embodiments, the ECC circuit 115 may try to correct the error bit again, using the provided soft decision data.

In some embodiments, an on-chip valley search operation may be performed via the read operation of the hard decision data and the soft decision data executed in FIG. 8.

For example, the count unit 170 may count the number of memory cells determined as the on-cells by the first read voltage VR1 and the second read voltage VR2, respectively. The memory cell determined as the on-cell by the first read voltage VR1 means a memory cell having a threshold voltage lower than the first read voltage VR1. The memory cell determined as the on-cell by the second read voltage VR2 means a memory cell having a threshold voltage lower than the second read voltage VR2. If the number of memory cells determined as the on-cells by the second read voltage VR2 is subtracted from the number of memory cells determined as the on-cells by the first read voltage VR1, the number of the memory cells having the voltage level between the first read voltage VR1 and the second read voltage VR2 as the threshold voltage is calculated.

Further, the count unit 170 may count the number of memory cells determined as the off-cell by the first read voltage VR1 and the third read voltage VR2, respectively. The memory cell determined as the off-cell by the first read voltage VR1 means a memory cell having a threshold voltage higher than the first read voltage VR1. The memory cell determined as the off-cell by the third read voltage VR3 means a memory cell having a threshold voltage higher than the third read voltage VR2. If the number of memory cells determined as the on-cells by the third read voltage VR3 is subtracted from the number of memory cells determined as the on-cells by the first read voltage VR1, the number of the memory cells having the voltage level between the first read voltage VR1 and the third read voltage VR3 as the threshold voltage is counted.

However, count of the number of such memory cells does not require the addition of a special process. In the process of determining the hard decision data and the soft decision data earlier, the count unit 170 may count the memory cells determined as the on-cells and the off-cells from the data stored in the first to third latches 181 to 183.

When the number of memory cells having the voltage level between the first read voltage VR1 and the second read voltage VR2 as the threshold voltage is compared to the number of memory cells having the voltage level between the first read voltage VR1 and the third read voltage VR3 as the threshold voltage, distribution valleys of the memory cell may be determined.

For example, when the number of memory cells having the voltage level between the first read voltage VR1 and the second read voltage VR2 as the threshold voltage is similar to the number of memory cells having the voltage level between the first read voltage VR1 and the third read voltage VR3 as the threshold voltage, the first read voltage VR1 may be determined as the distribution valley. Alternatively, if the number of memory cells having the voltage level between the first read voltage VR1 and the second read voltage VR2 as the threshold voltage is larger than the number of memory cells having the voltage level between the first read voltage VR1 and the third read voltage VR3 as the threshold voltage, there is high probability that the distribution valley may be located between the first read voltage VR1 and the second read voltage VR2.

The nonvolatile memory device according to the embodiment of the present disclosure may obtain the same effect as the case of applying the different read voltages to the same word line by adjusting the providing time point of the first to third latch signals (LS1 to LS3) provided to first to third latches 181 to 183 for executing the on-chip valley search.

Figure 11:
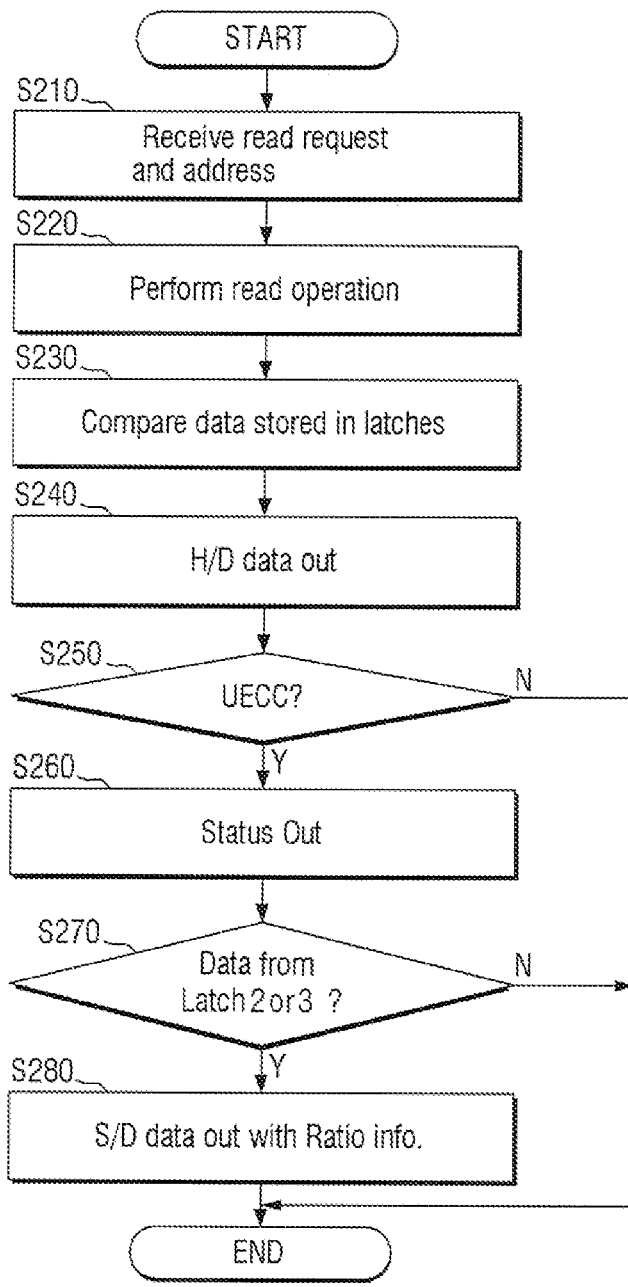
FIGS. 11 and 12 are flowcharts illustrating an operation of the nonvolatile memory device according to some embodiments of the present disclosure.

FIG. 11 is a flowchart illustrating an operation of the nonvolatile memory device according to some embodiments of the present disclosure.

Referring to FIG. 11, in the nonvolatile memory device according to some embodiments of the present disclosure, since a step (S210) in which the memory controller 110 receives a reading request and an address from the memory controller 110, and a step (S220) in which the memory controller 110 performs the reading operation of the data stored in the nonvolatile memory device are the same as the operation of the nonvolatile memory device described above using FIGS. 8 through 10, the detailed description thereof will not be provided.

Next, as a result of the reading operation, the data stored in the first to third latches 181 to 183 are compared (S230).

For example, as described above using FIG. 8, the number of memory cells determined as the on-cells on the basis of the data stored in the first latch 181, the number of memory cells determined as the on-cells on the basis of the data stored in the second latch 182, and the number of the memory cells determined as the on-cells on the basis of the data stored in the third latch 183 are compared.

In operation S240, the page buffer unit PB0 may output data (e.g., hard decision data) stored in the C-latch 185 (e.g., a fifth latch) to the data input output circuit 190 and the data input output circuit 190 may provide the hard decision data to the ECC circuit 115 of the memory controller 110.

Subsequently, since the determination (S250) whether the UECC occurs in the hard decision data is the same as that explained above with reference to FIGS. 8 through 10, the detailed explanation thereof will not be provided.

Among the comparison results of the data stored in the first to third latches 181 to 183, the output target is determined (S260).

As a result of the comparison in step S230, if the number of memory cells determined as the on-cell among the data stored in the second latch 182 is larger than the number of memory cells determined as the on-cells on the basis of the data stored in the third latch 183, the first soft-decision read value stored in the second latch 182 may be determined as a target data to be output to the data input and output circuit 190.

Alternatively, if the number of memory cells determined as the on-cell among the data stored in the third latch 183 is larger than the number of memory cells determined as the on-cells on the basis of the data stored in the second latch 182, the third soft-decision read value stored in the third latch 183 may be determined as a target to be output to the data input and output circuit 190.

If the number of memory cells determined as the on-cell among the data stored in the second latch 182 is similar to the number of memory cells determined as the on-cells on the basis of the data stored in the third latch 183, the hard decision data stored in the first latch 181 may be determined as a target to be output to the data input and output circuit 190.

Subsequently, it is determined whether or not the data stored in the second latch 182 or the third latch 183 is determined as the output target to the data input and output circuit 190 (S270). If the data stored in the second latch 182 or the third latch 183 is determined as the output target to the data input and output circuit 190 (Y), ratio information of the soft data may be output to the data input and output circuit 190, together with the soft decision data stored in the second latch 182 or the third latch 183 (S280).

Figure 12:
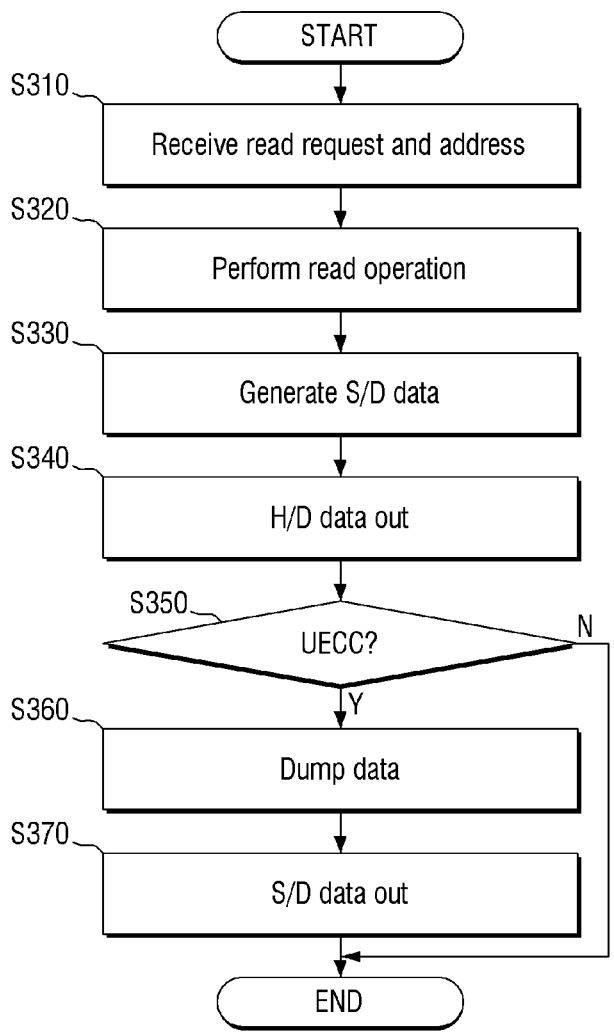

FIG. 12 is a flowchart for explaining an operation method of the nonvolatile memory device according to some example embodiments.

Referring to FIG. 12, the method of operating the nonvolatile memory device 120 includes receiving a reading request command CMD (e.g., a read command) and an address ADDR from the memory controller 110 (S310).

Subsequently, the memory controller 110 performs a reading operation of the data stored in the nonvolatile memory device 120 (S320) in which the memory controller 110 performs the reading operation of the data stored in the nonvolatile memory device 120 in the same way as the operation of the nonvolatile memory device 120 described above using FIGS. 8 through 10 except the operation of generating the fourth read data (i.e., soft decision data) thus, the detailed description thereof will not be provided.

In operation S330, the page buffer unit PB0 generates the soft decision data by performing an XNOR operation of the second and third read data (i.e., first and second soft decision values). Subsequently, the page buffer unit PB0 latches the soft decision data by the fourth latch 184. In an example embodiment, the soft decision data may be generated in response to an additional command received from the memory controller 110 instead of the read command.

In operation S340, the page buffer unit PB0 outputs the hard decision data stored in the C-latch 185 to the data input output circuit 190 and the data input output circuit 190 provides the hard decision data to the ECC circuit 115 of the memory controller 110.

In operation S350, the ECC circuit 115 performs an error correction of the hard decision data. If the error correction fails (i.e., a UECC occurs) the method proceeds to operation S360.

In operation S360, a fifth latch (i.e., C-latch) 185 stores the soft decision data in response to the dump signal Dump.

In operation S370, the page buffer unit PB0 provides the soft decision data stored in the fifth latch (i.e., C-latch) 185 to the data input output circuit 190 and the data input output circuit 190 provides the soft decision data to the ECC circuit 115 of the memory controller 110. The ECC circuit may perform a second error correction using the soft decision data. In operation S370, the ratio information of the soft decision data is output when the data input output circuit 190 outputs the soft decision data.

While the present disclosure has been particularly shown and described with reference to embodiments thereof, it will be understood that various changes in form and details may be made therein without departing from the spirit and scope of the following claims.

What is claimed is:
1. A nonvolatile memory device comprising:
a cell array including a plurality of memory cells configured to store program data; and
a page buffer including a plurality of page buffer units each connected to a set of the plurality of memory cells through one bit line of a plurality of bit lines connected to a sensing node, and configured to generate output data based on data states of the set of the plurality of memory cells,
wherein a first page buffer unit of the plurality of page buffer units includes:
a first latch configured to latch a first read data at a first time point by developing a voltage level of the sensing node based on data state of a selected memory cell,
second and third latches configured to latch second and third read data at second and third time points, respectively by developing the voltage level of the sensing node, wherein the second time point is earlier than the first time point and the third time point is later than the first time point, and
a fourth latch configured to generate a fourth read data based on the second and third read data,
wherein the first page buffer unit is configured to selectively output the fourth read data as the output data, depending on whether an error correction of the first read data is possible.
2. The nonvolatile memory device of claim 1, wherein the nonvolatile memory device is configured such that a selected word line connected to the selected memory cell is applied the same voltage level during developing the voltage level of the sensing node.

3. The nonvolatile memory device of claim 1, wherein a difference between the second time point and the first time point is the same as a difference between the third time point and the first time point.

4. The nonvolatile memory device of claim 1, wherein the first page buffer unit includes a logic circuit configured to perform an XNOR operation of the second and third read data and configured to generate the fourth read data.

5. The nonvolatile memory device of claim 1, wherein the first page buffer unit is configured such that the first page buffer unit outputs the first read data as the output data when the error correction of the first read data is possible.

6. The nonvolatile memory device of claim 1, wherein the first page buffer unit further includes a fifth latch configured to store the first or fourth read data.

7. The nonvolatile memory device of claim 1, wherein the nonvolatile memory device is connected to a memory controller including an error correction code (ECC) circuit,
wherein the first page buffer unit is configured to provide the first read data to the ECC circuit as the output data such that the ECC circuit performs the error correction of the first read data, and
wherein the first page buffer unit is configured to provide the fourth read data to the ECC circuit as the output data when the ECC circuit fails the error correction of the first read data.

8. The nonvolatile memory device of claim 1, wherein the first page buffer unit is configured to generate the first to third read data in response to a single read command received from a memory controller.

9. The nonvolatile memory device of claim 8, wherein the first page buffer unit is configured to generate the fourth read data in response to either the single read command or an additional command received from the memory controller.

10. A method of operating a nonvolatile memory device, the method comprising:
applying a read voltage to a first word line of a plurality of word lines connected to a first memory cell of a plurality of memory cells;
pre-charging a first bit line of a plurality of bit lines connected to the first memory cell;
charging a sensing node connected to the first bit line to a first voltage;
developing a voltage level of the sensing node through the first bit line based on data state of the first memory cell;
latching first read data at a first time point by developing the voltage level of the sensing node;
latching second and third read data at second and third time points, respectively by developing the voltage level of the sensing node, wherein the first to third time points are different from each other;
generating a fourth read data based on the second and third read data; and
selectively outputting the fourth read data as an output data depending on whether an error correction of the first read data is possible.

11. The method of claim 10, further comprising:
outputting the first read data as the output data to perform the error correction of the first read data.

12. The method of claim 10,
wherein the second time point is earlier than the first time point, and
wherein the third time point is later than the first time point.

13. The method of claim 12, wherein a difference between the second time point and the first time point is the same as a difference between the third time point and the first time point.

14. The method of claim 10, wherein the fourth read data is generated by performing an XNOR operation of the second read data and the third read data.

15. The method of claim 10, wherein the latching first to third read data occurs by receiving a single read command from a memory controller.

16. The method of claim 15, wherein the generating fourth read data occurs by receiving either the single read command or an additional command from the memory controller.

17. A nonvolatile memory device comprising:
a cell array including a plurality of memory cells configured to store program data; and
a page buffer including a plurality of page buffer units each connected to a set of the plurality of memory cells through one bit line of a plurality of bit lines connected to a sensing node, and configured to generate output data based on data states of the set of the plurality of memory cells,
wherein a first page buffer unit of the plurality of page buffer units includes:
first to third latches configured to, in response to a single read command received from a memory controller, latch first to third read data at first to third time points, respectively by developing a voltage level of the sensing node based on data state of a selected memory cell, wherein the first to third time points are different from each other, and
a fourth latch configured to generate a fourth read data based on the second and third read data,
wherein the first page buffer unit is configured to selectively output the fourth read data as the output data, depending on whether an error correction of the first read data is possible by an error correction code (ECC) circuit.

18. The nonvolatile memory device of claim 17, wherein the first page buffer unit is configured such that the first page buffer unit outputs the first read data as the output data when the error correction of the first read data is performed by the ECC circuit.

19. The nonvolatile memory device of claim 18,
wherein the second time point is earlier than the first time point, and
wherein the third time point is later than the first time point.

20. The nonvolatile memory device of claim 19, wherein the first page buffer unit is configured such that the first page buffer unit generates the fourth read data by receiving either the single read command or an additional command from the memory controller.

* * * * *